(12) United States Patent  (10) Patent No.: US 8,647,981 B1
Sipani  (45) Date of Patent: Feb. 11, 2014

(54) METHODS OF FORMING PATTERNS, AND METHODS OF FORMING INTEGRATED CIRCUITRY

(75) Inventor: Vishal Sipani, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/600,714

(22) Filed: Aug. 31, 2012

(51) Int. Cl.
*H01L 21/3065* (2006.01)
*H01L 23/31* (2006.01)

(52) U.S. Cl.
USPC ............ 438/675; 438/702; 257/E21.249; 257/E21.305; 216/72; 216/37

(58) Field of Classification Search
CPC ............ H01L 21/30655; H01L 23/3192
USPC ............ 438/669, 671, 702, 675, 703, 699; 257/E21.215, E21.268, E21.249, 257/E23.141, E21.02, E21.305; 716/126, 716/139; 216/37, 72, 78
See application file for complete search history.

(56) References Cited

U.S. PATENT DOCUMENTS

| | | | | |
|---|---|---|---|---|
| 6,387,736 | B1* | 5/2002 | Cao et al. ........................ | 438/149 |
| 7,572,572 | B2 | 8/2009 | Wells | |
| 7,662,721 | B2* | 2/2010 | Manger et al. ................. | 438/717 |
| 7,737,039 | B2* | 6/2010 | Sandhu et al. ................. | 438/696 |
| 7,846,756 | B2* | 12/2010 | Yen et al. ........................ | 438/42 |
| 8,216,939 | B2* | 7/2012 | Sipani et al. .................. | 438/675 |
| 2001/0036745 | A1 | 11/2001 | Sandhu | |
| 2003/0199169 | A1* | 10/2003 | Jun et al. ....................... | 438/694 |
| 2006/0115747 | A1 | 6/2006 | Lee et al. | |
| 2007/0048674 | A1* | 3/2007 | Wells ............................. | 430/313 |
| 2008/0057692 | A1* | 3/2008 | Wells et al. ................... | 438/597 |
| 2008/0081461 | A1* | 4/2008 | Lee et al. ....................... | 438/637 |
| 2008/0194108 | A1* | 8/2008 | Kim et al. ...................... | 438/703 |
| 2008/0290527 | A1* | 11/2008 | Abatchev et al. .............. | 257/774 |
| 2009/0294842 | A1* | 12/2009 | Juengling ....................... | 257/329 |
| 2010/0130011 | A1* | 5/2010 | Endoh et al. ................... | 438/689 |
| 2011/0070738 | A1* | 3/2011 | Liang et al. .................... | 438/702 |
| 2011/0159693 | A1* | 6/2011 | Sun ................................. | 438/703 |
| 2011/0171809 | A1* | 7/2011 | Scheuerlein et al. .......... | 438/381 |
| 2011/0177691 | A1* | 7/2011 | Kang .............................. | 438/694 |
| 2012/0040528 | A1* | 2/2012 | Kim et al. ...................... | 438/675 |
| 2012/0045896 | A1* | 2/2012 | Sipani et al. ................... | 438/675 |
| 2012/0135601 | A1* | 5/2012 | Park et al. ...................... | 438/675 |
| 2012/0147674 | A1* | 6/2012 | Park et al. ................. | 365/185.05 |
| 2013/0109148 | A1* | 5/2013 | Oh et al. ........................ | 438/382 |

FOREIGN PATENT DOCUMENTS

TW          291603 B     11/1996

* cited by examiner

*Primary Examiner* — Jarrett Stark
*Assistant Examiner* — Bitew Dinke
(74) *Attorney, Agent, or Firm* — Wells St. John P.S.

(57) ABSTRACT

Some embodiments include methods of forming a pattern. First lines are formed over a first material, and second lines are formed over the first lines. The first and second lines form a crosshatch pattern. The first openings are extended through the first material. Portions of the first lines that are not covered by the second lines are removed to pattern the first lines into segments. The second lines are removed to uncover the segments. Masking material is formed between the segments. The segments are removed to form second openings that extend through the masking material to the first material. The second openings are extended through the first material. The masking material is removed to leave a patterned mask comprising the first material having the first and second openings therein. In some embodiments, spacers may be formed along the first and second lines to narrow the openings in the crosshatch pattern.

30 Claims, 16 Drawing Sheets

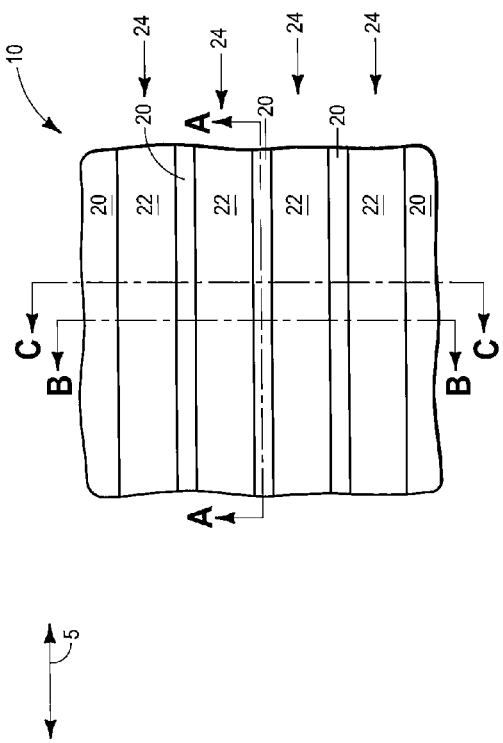
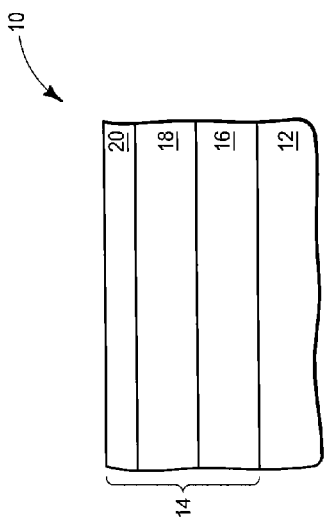
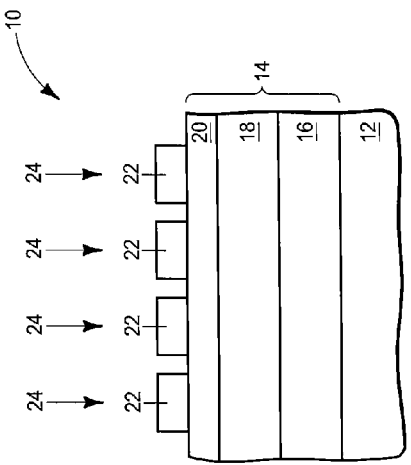
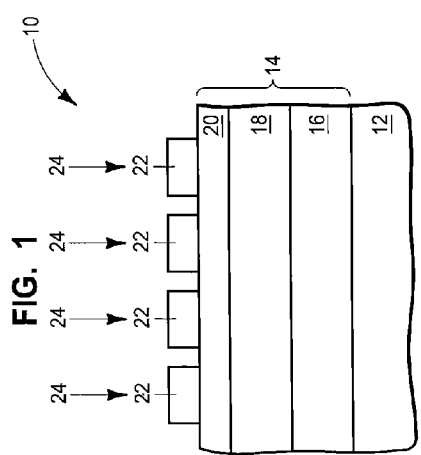
FIG. 1
FIG. 2 (A-A)
FIG. 3 (B-B)
FIG. 4 (C-C)

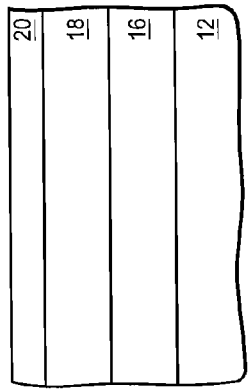
FIG. 6 (A-A)
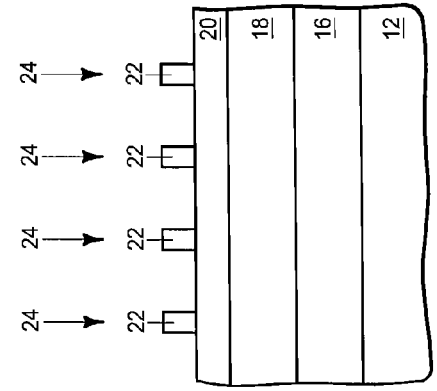
FIG. 8 (C-C)
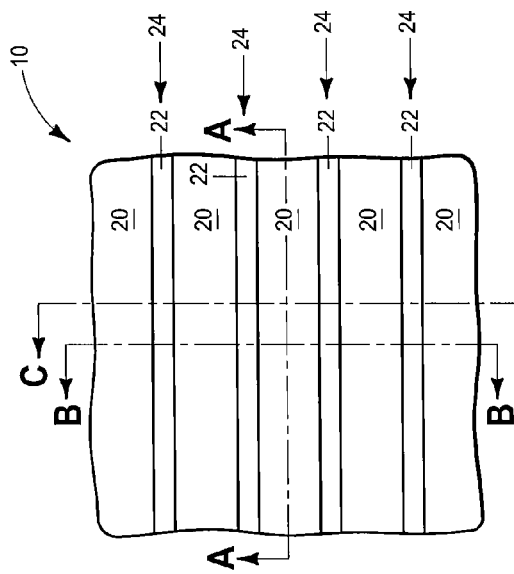
FIG. 5
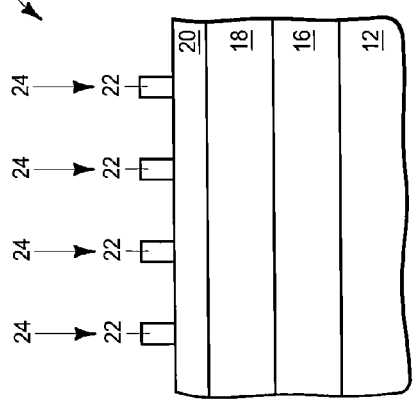
FIG. 7 (B-B)

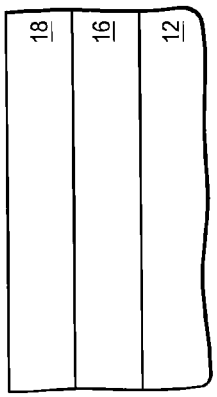
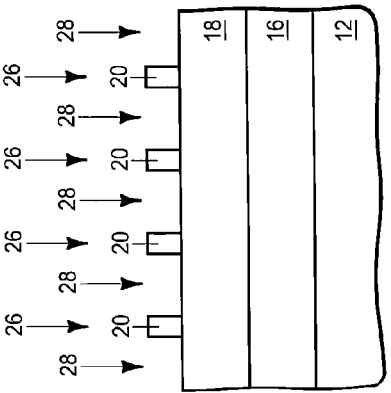
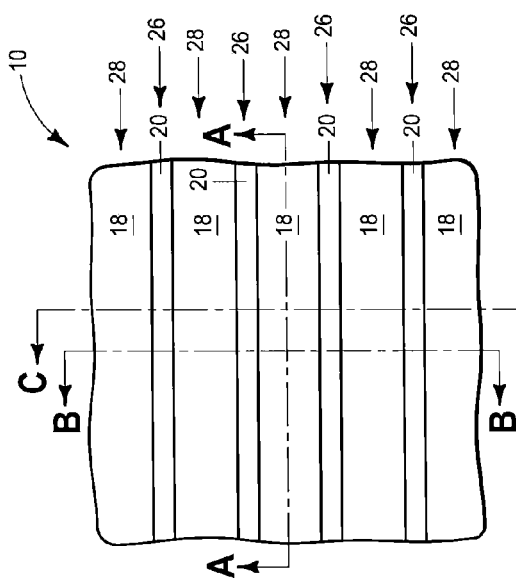
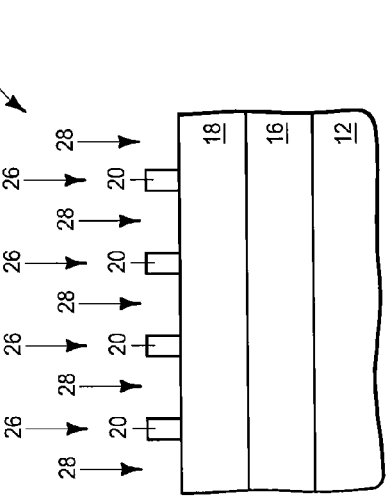

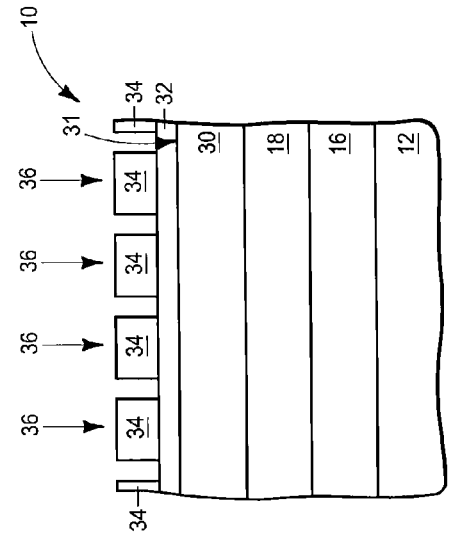
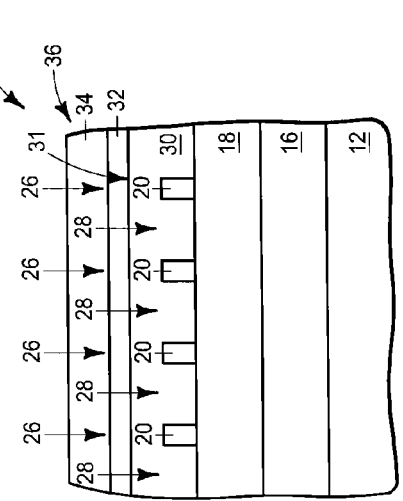
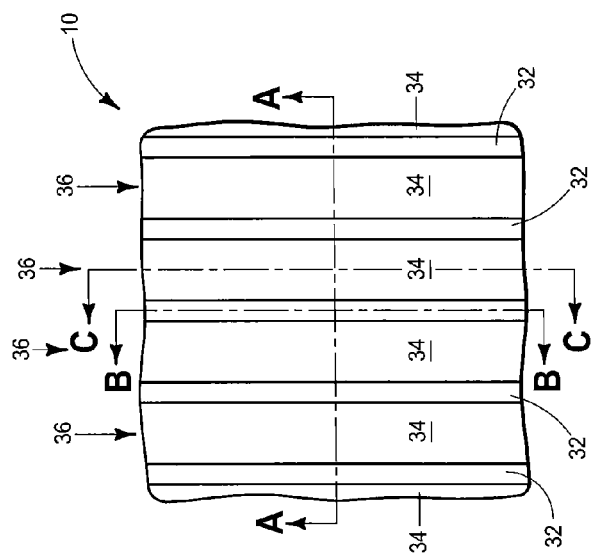
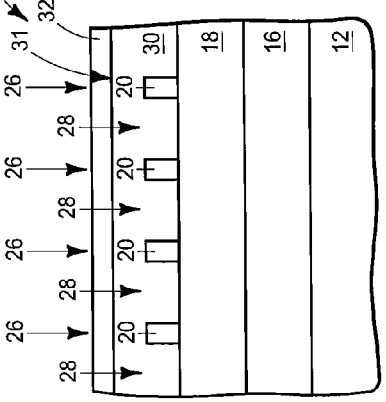
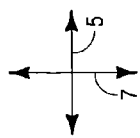

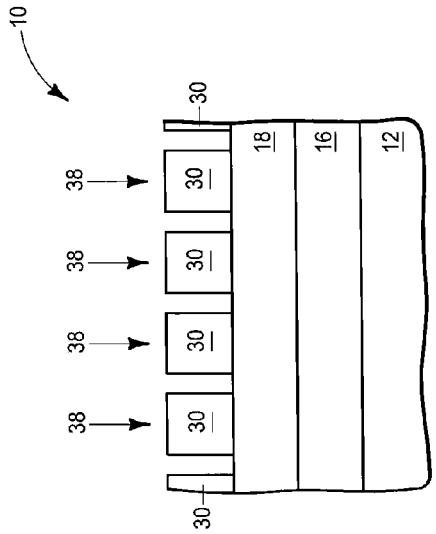
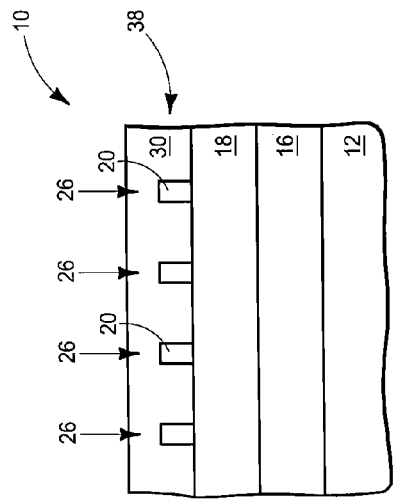
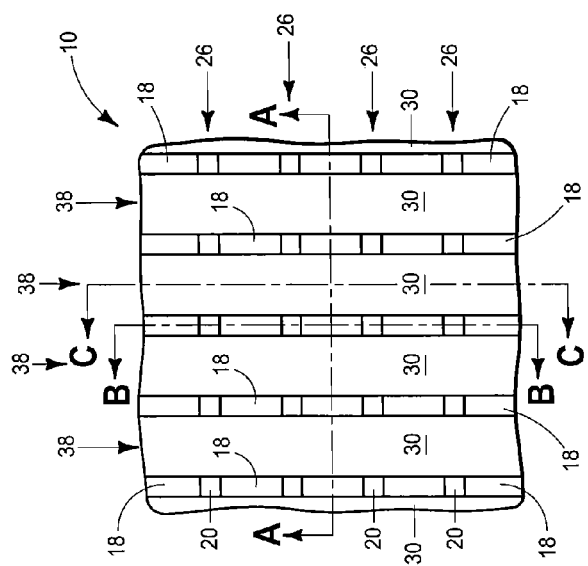
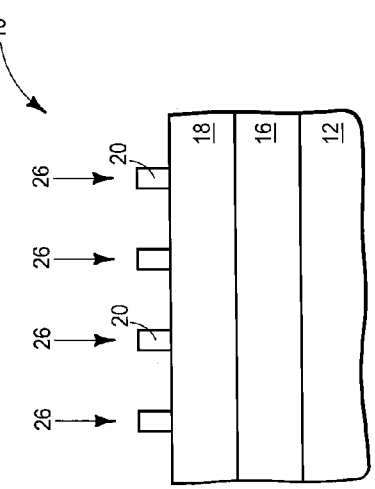
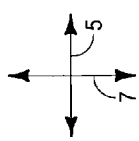

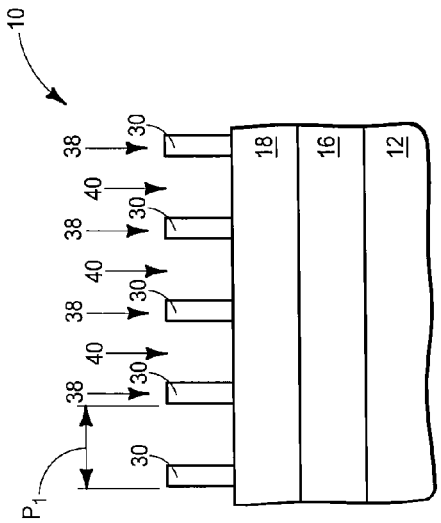
FIG. 22 (A-A)
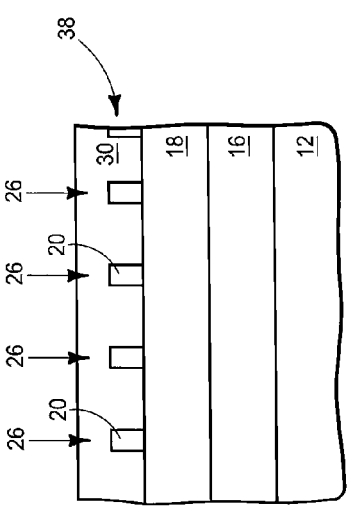
FIG. 24 (C-C)
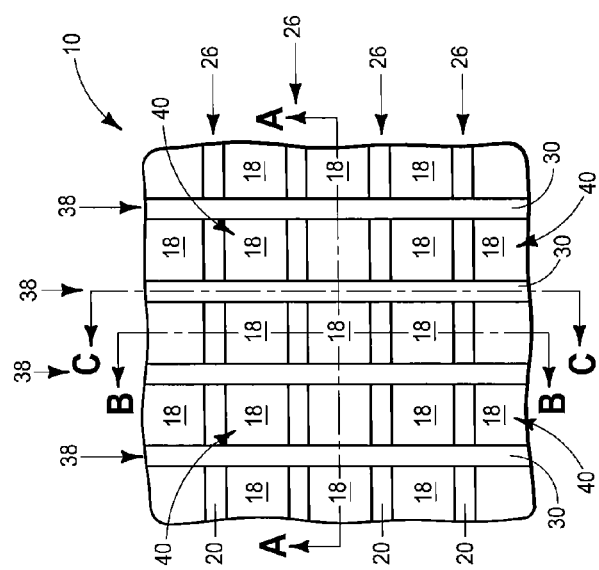
FIG. 21
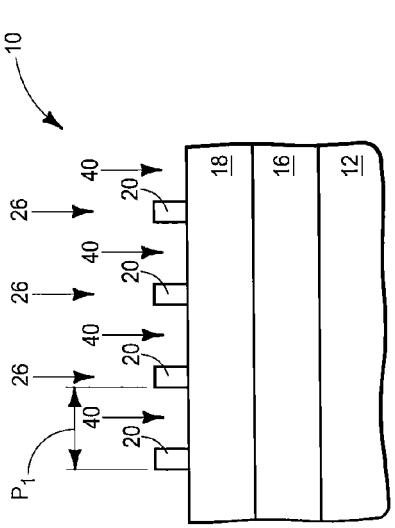
FIG. 23 (B-B)
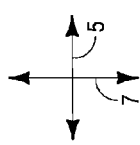

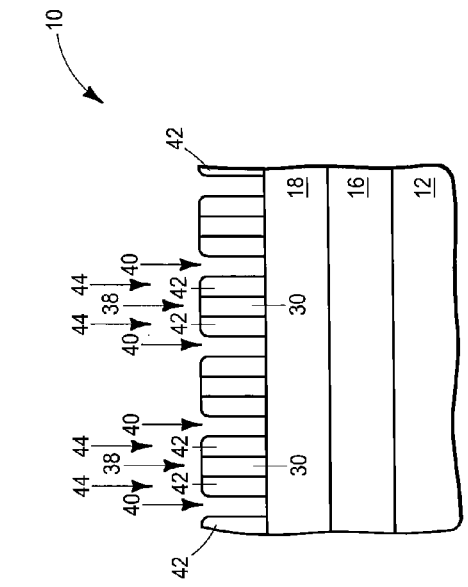
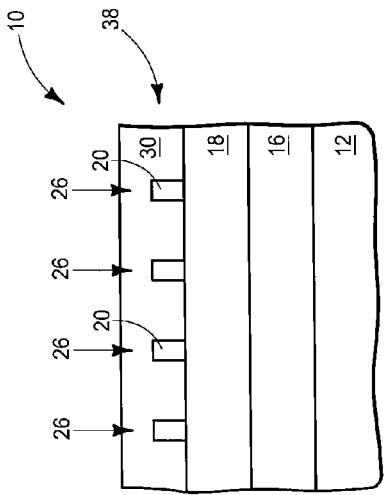
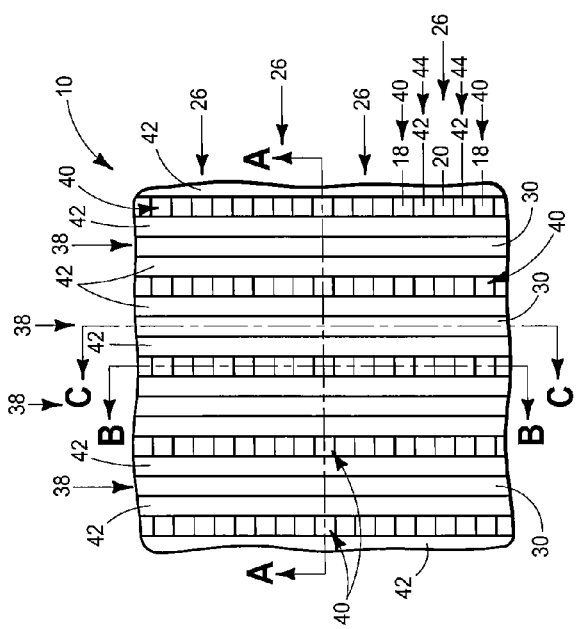
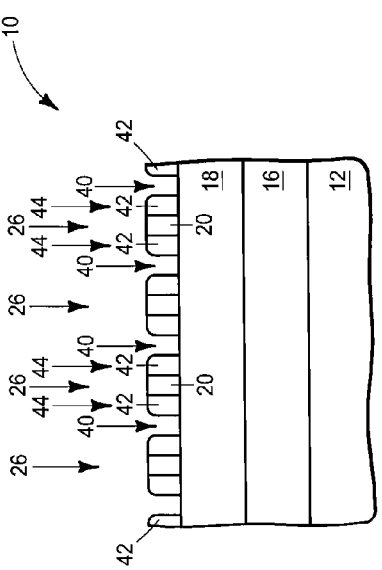
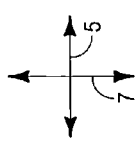
FIG. 25
FIG. 26 (A-A)
FIG. 27 (B-B)
FIG. 28 (C-C)

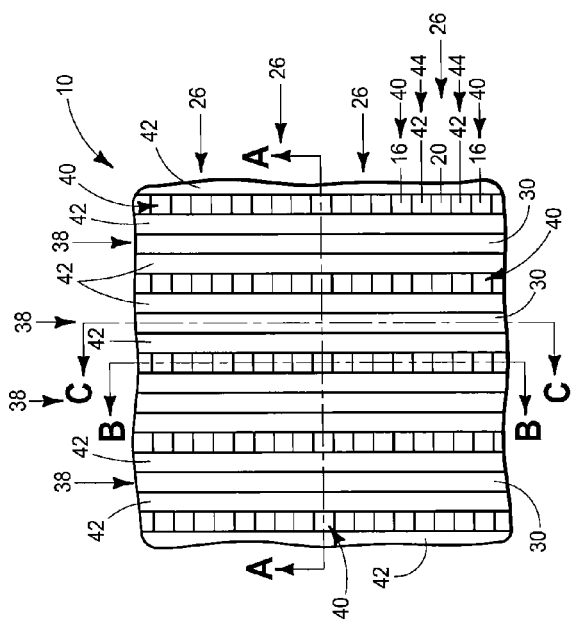
FIG. 29
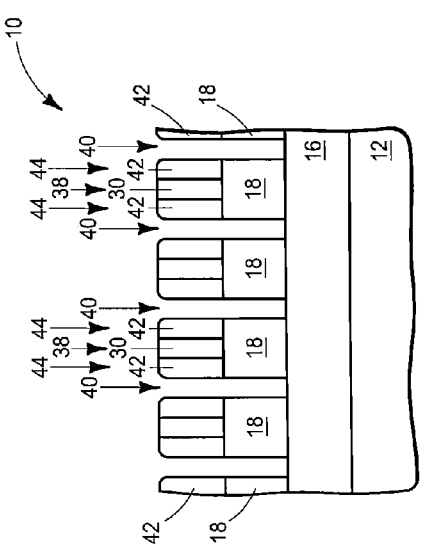
FIG. 30 (A-A)
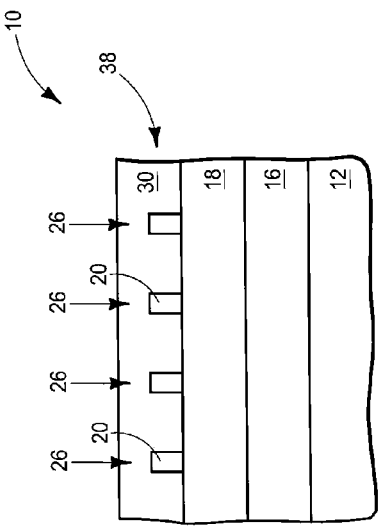
FIG. 32 (C-C)
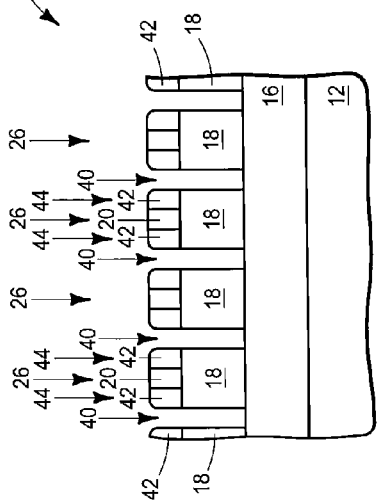
FIG. 31 (B-B)

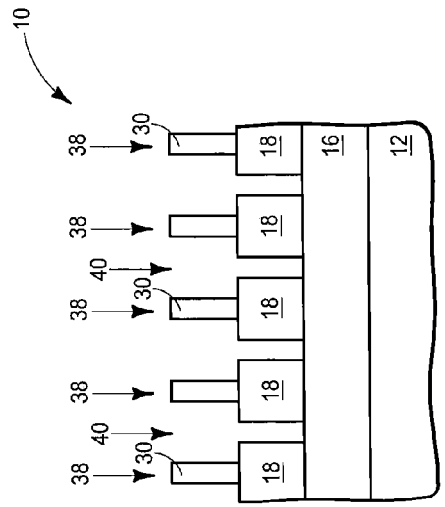
FIG. 34 (A-A)
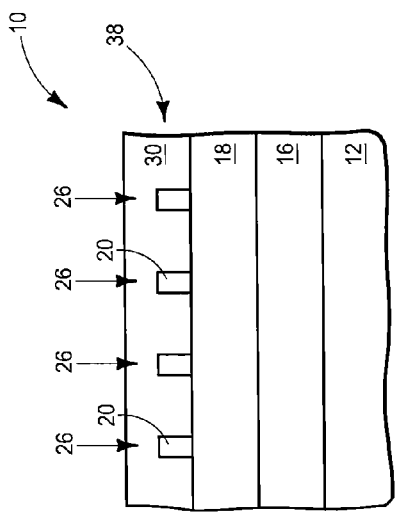
FIG. 36 (C-C)
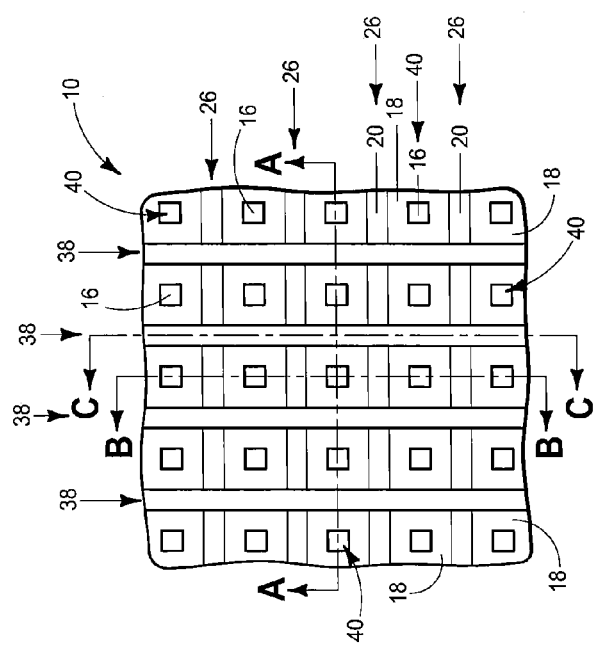
FIG. 33
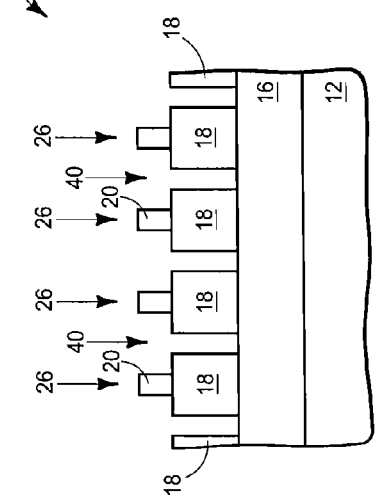
FIG. 35 (B-B)

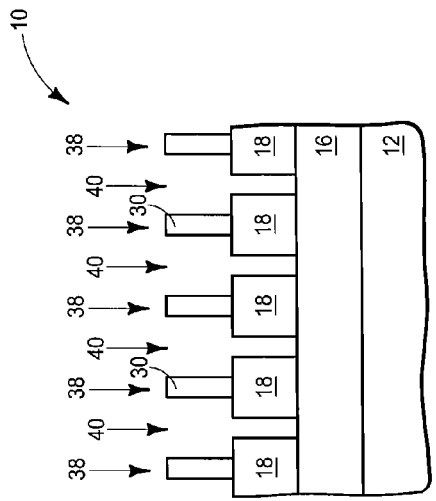
FIG. 38 (A-A)
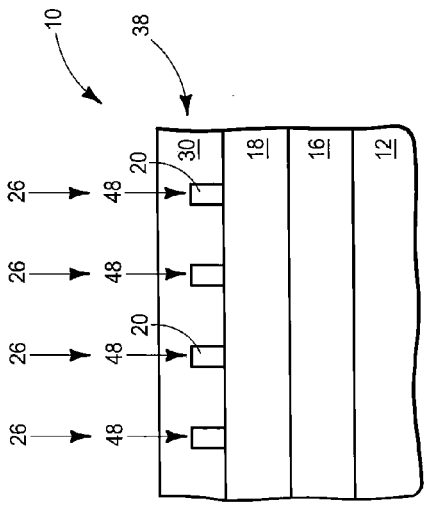
FIG. 40 (C-C)
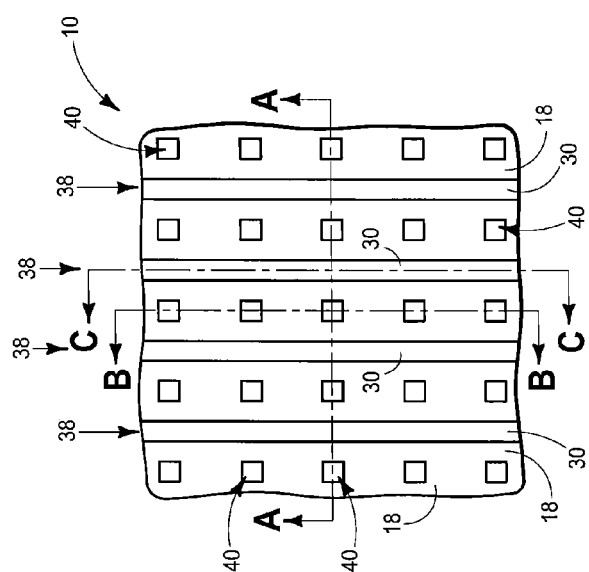
FIG. 37
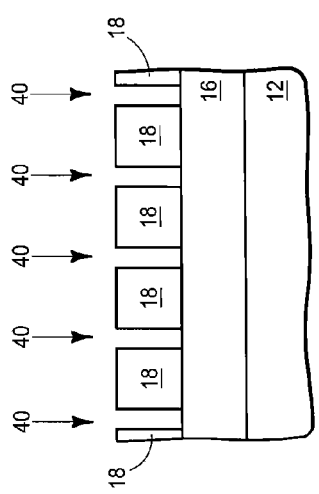
FIG. 39 (B-B)
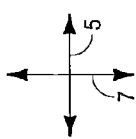

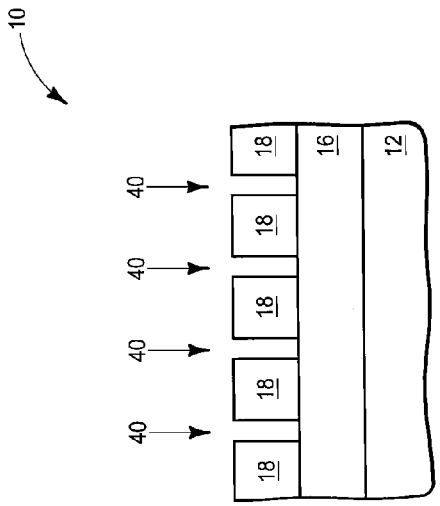
FIG. 42 (A-A)
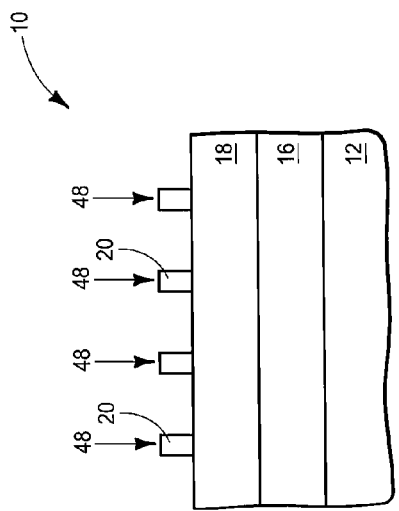
FIG. 44 (C-C)
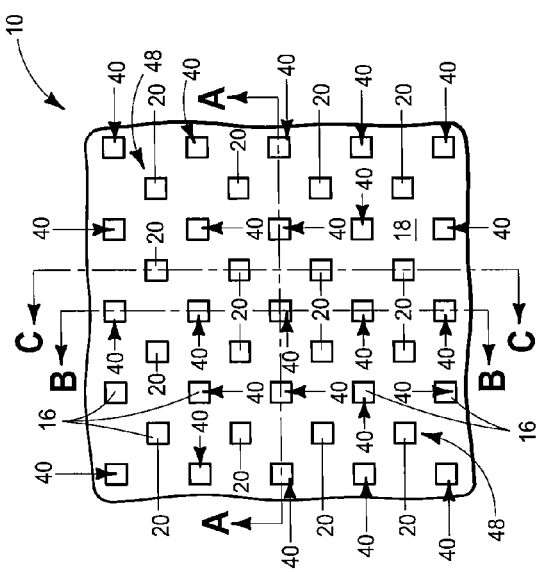
FIG. 41
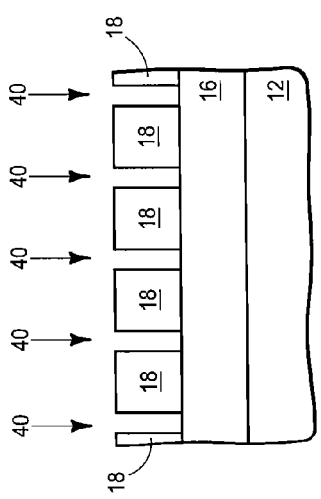
FIG. 43 (B-B)

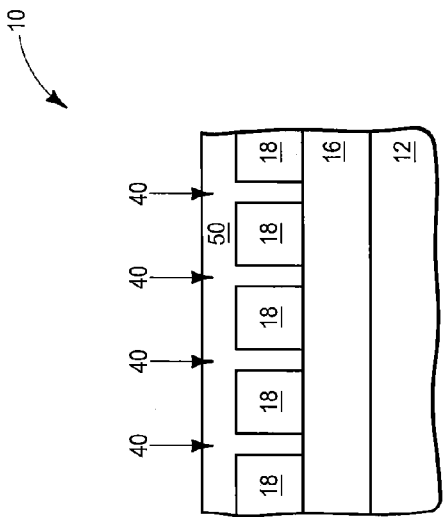
FIG. 46 (A-A)
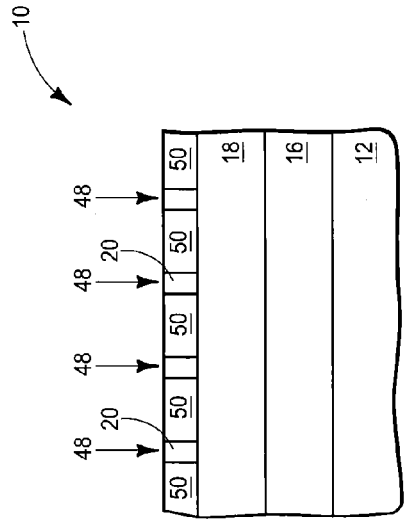
FIG. 48 (C-C)
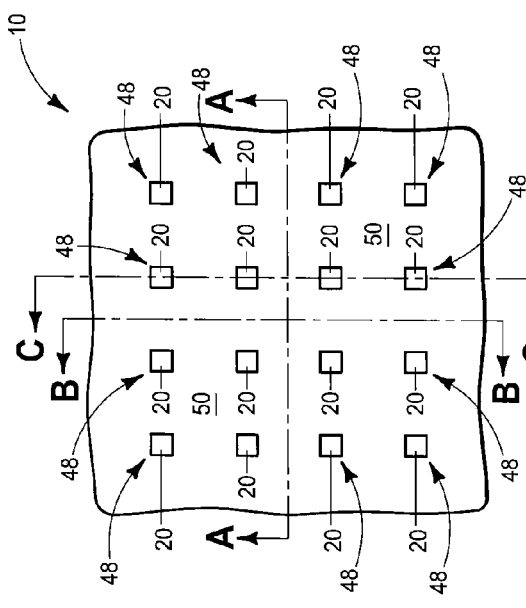
FIG. 45
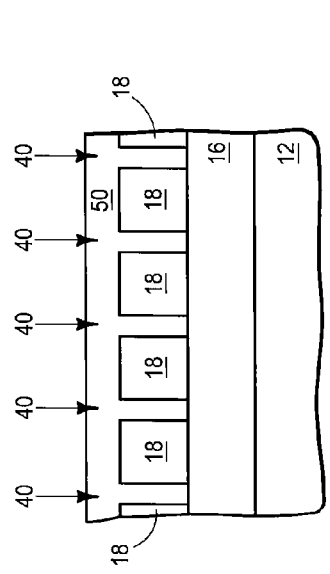
FIG. 47 (B-B)
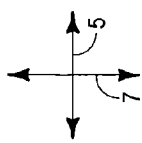

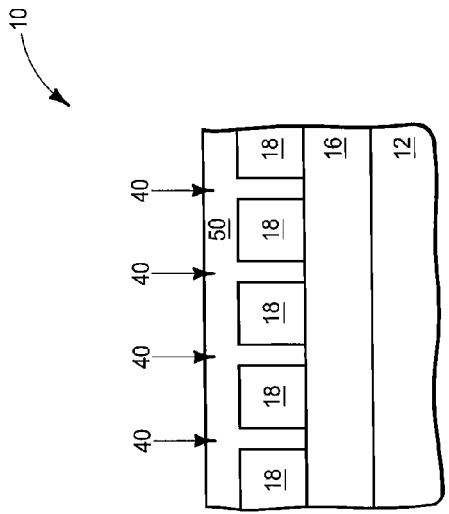
FIG. 50 (A-A)
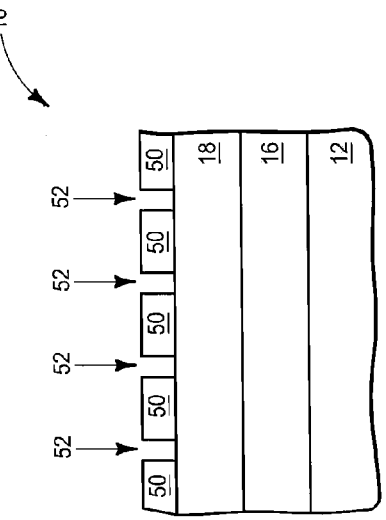
FIG. 52 (C-C)
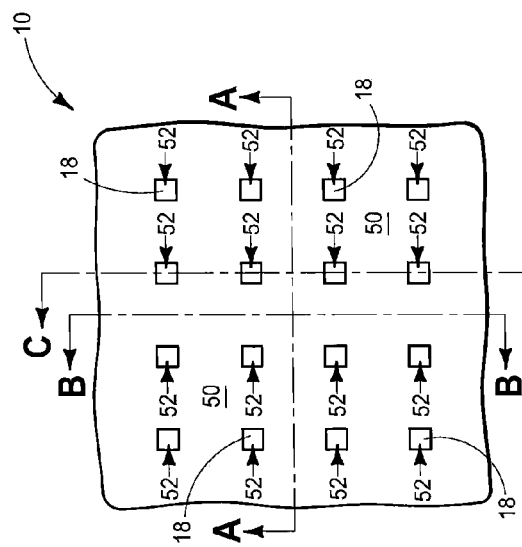
FIG. 49
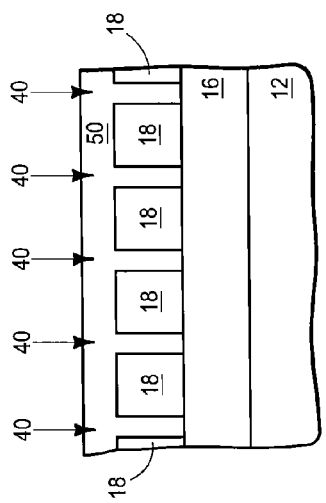
FIG. 51 (B-B)
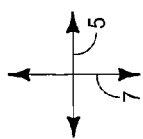

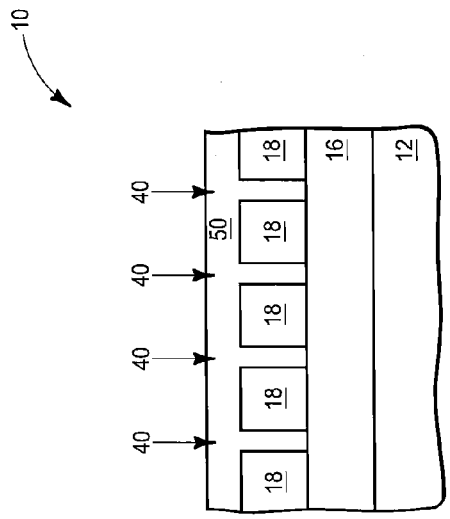
FIG. 54 (A-A)
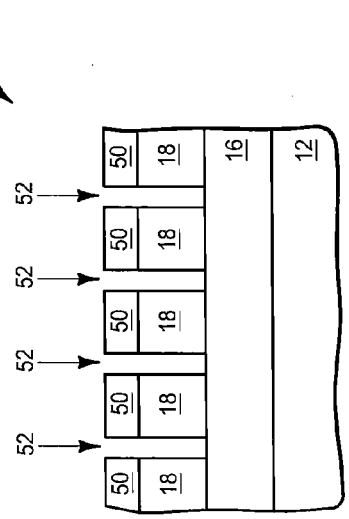
FIG. 56 (C-C)
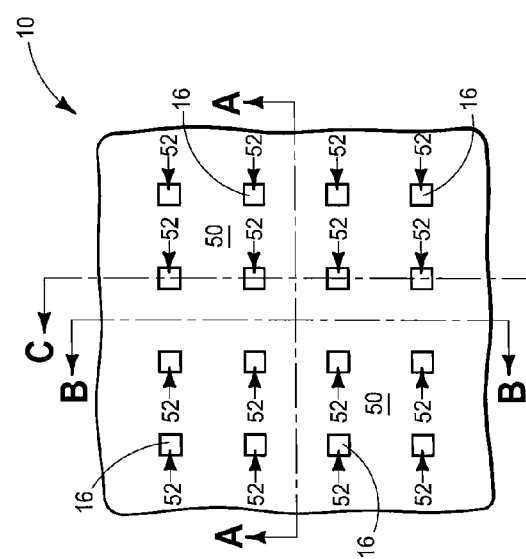
FIG. 53
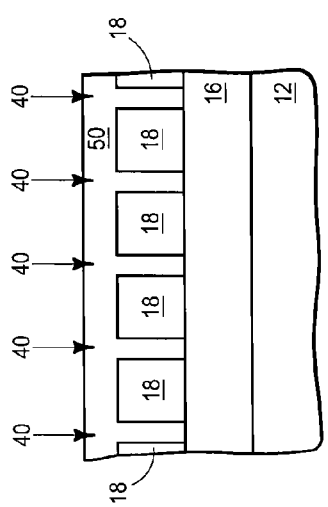
FIG. 55 (B-B)
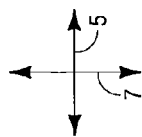

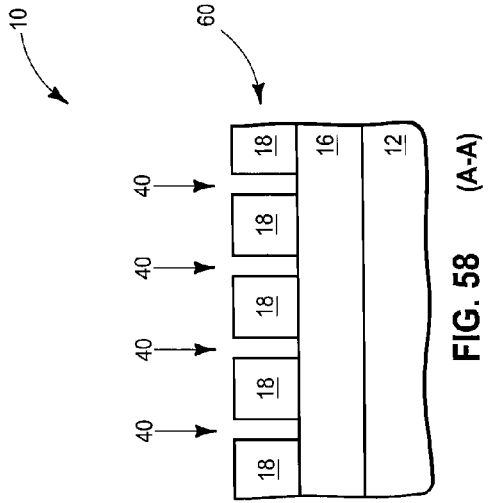
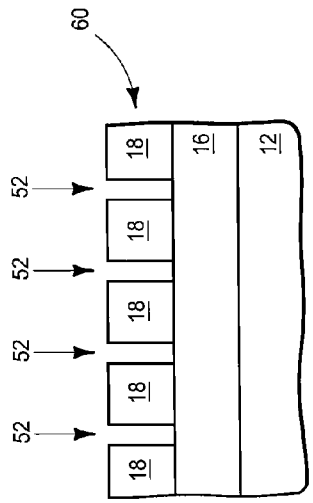
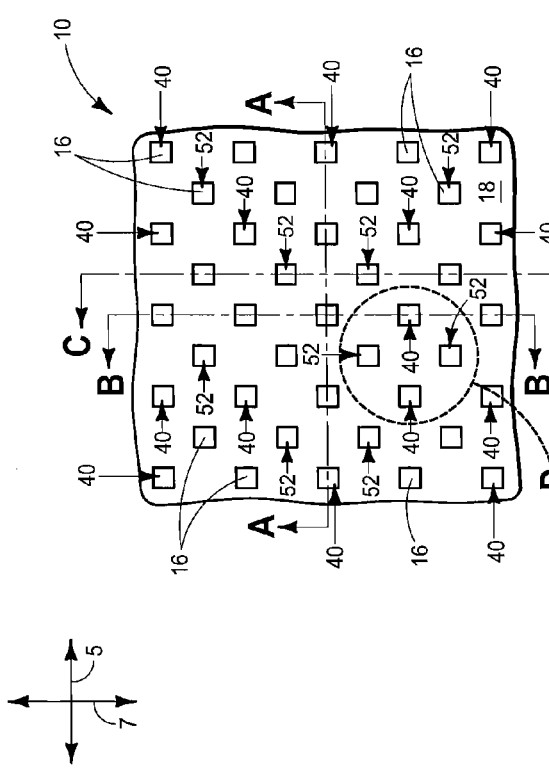
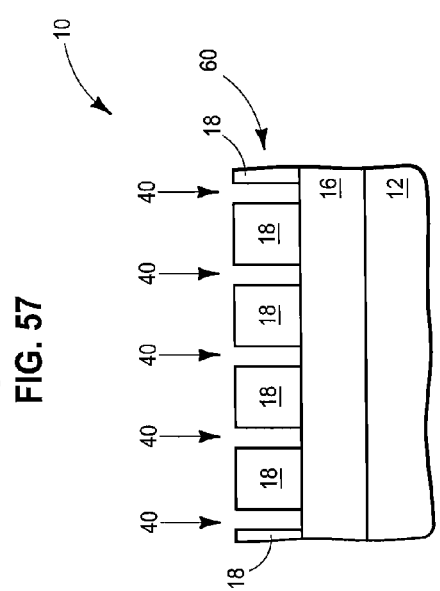
FIG. 58 (A-A)
FIG. 60 (C-C)
FIG. 57
FIG. 59 (B-B)

METHODS OF FORMING PATTERNS, AND METHODS OF FORMING INTEGRATED CIRCUITRY

TECHNICAL FIELD

Methods of forming patterns, and methods of forming integrated circuitry.

BACKGROUND

A continuing goal in semiconductor processing is to reduce the size of individual electronic components, and to thereby enable smaller and denser integrated circuitry. For instance, it can be desired to form memory circuitry (such as DRAM, NAND memory, etc.) to increasingly higher levels of integration.

A concept commonly referred to as "pitch" can be used to quantify the density of an integrated circuit pattern. Pitch may be defined as the distance between an identical point in two neighboring features of a repeating pattern. Feature size limitations of a lithographic technique can set a minimum pitch that can be obtained from the lithographic technique.

Lithographic processes, such as photolithography, are commonly utilized during semiconductor processing for fabricating integrated structures. Lithographic processes have minimum capable feature sizes, F, which are the smallest feature sizes that can be reasonably formed with the processes. For instance, photolithography may be limited by factors such as optics and radiation wavelength.

Pitch multiplication, such as pitch-doubling, is a method for extending the capabilities of lithographic techniques beyond their minimum pitches. Pitch multiplication may involve forming sub-lithographic features (i.e., features narrower than minimum lithographic resolution) by depositing a material to have a thickness which is less than that of the minimum capable lithographic feature size, F. The material may be anisotropically etched to form the sub-lithographic features. The sub-lithographic features may then be used for integrated circuit fabrication to create higher density circuit patterns than can be achieved with conventional lithographic processing.

It is desired to develop new methods of patterning which are suitable for fabrication of highly-integrated structures.

BRIEF DESCRIPTION OF THE DRAWINGS

FIGS. 1-60 illustrate a semiconductor construction at various stages of an example embodiment method of forming a pattern.

FIG. 1 shows a top view of the construction, and

FIGS. 2-4 show cross-sectional side views along the lines A-A, B-B and C-C of FIG. 1, respectively.

FIG. 5 shows a top view of the construction at a processing stage subsequent to that of FIG. 1, and FIGS. 6-8 show cross-sectional side views along the lines A-A, B-B and C-C of FIG. 5, respectively.

FIG. 9 shows a top view of the construction at a processing stage subsequent to that of FIG. 5, and FIGS. 10-12 show cross-sectional side views along the lines A-A, B-B and C-C of FIG. 9, respectively.

FIG. 13 shows a top view of the construction at a processing stage subsequent to that of FIG. 9, and FIGS. 14-16 show cross-sectional side views along the lines A-A, B-B and C-C of FIG. 13, respectively.

FIG. 17 shows a top view of the construction at a processing stage subsequent to that of FIG. 13, and FIGS. 18-20 show cross-sectional side views along the lines A-A, B-B and C-C of FIG. 17, respectively.

FIG. 21 shows a top view of the construction at a processing stage subsequent to that of FIG. 17, and FIGS. 22-24 show cross-sectional side views along the lines A-A, B-B and C-C of FIG. 21, respectively.

FIG. 25 shows a top view of the construction at a processing stage subsequent to that of FIG. 21, and FIGS. 26-28 show cross-sectional side views along the lines A-A, B-B and C-C of FIG. 25, respectively.

FIG. 29 shows a top view of the construction at a processing stage subsequent to that of FIG. 25, and FIGS. 30-32 show cross-sectional side views along the lines A-A, B-B and C-C of FIG. 29, respectively.

FIG. 33 shows a top view of the construction at a processing stage subsequent to that of FIG. 29, and FIGS. 34-36 show cross-sectional side views along the lines A-A, B-B and C-C of FIG. 33, respectively.

FIG. 37 shows a top view of the construction at a processing stage subsequent to that of FIG. 33, and FIGS. 38-40 show cross-sectional side views along the lines A-A, B-B and C-C of FIG. 37, respectively.

FIG. 41 shows a top view of the construction at a processing stage subsequent to that of FIG. 37, and FIGS. 42-44 show cross-sectional side views along the lines A-A, B-B and C-C of FIG. 41, respectively.

FIG. 45 shows a top view of the construction at a processing stage subsequent to that of FIG. 41, and FIGS. 46-48 show cross-sectional side views along the lines A-A, B-B and C-C of FIG. 45, respectively.

FIG. 49 shows a top view of the construction at a processing stage subsequent to that of FIG. 45, and FIGS. 50-52 show cross-sectional side views along the lines A-A, B-B and C-C of FIG. 49, respectively.

FIG. 53 shows a top view of the construction at a processing stage subsequent to that of FIG. 49, and FIGS. 54-56 show cross-sectional side views along the lines A-A, B-B and C-C of FIG. 53, respectively.

FIG. 57 shows a top view of the construction at a processing stage subsequent to that of FIG. 53, and FIGS. 58-60 show cross-sectional side views along the lines A-A, B-B and C-C of FIG. 57, respectively.

DETAILED DESCRIPTION OF THE ILLUSTRATED EMBODIMENTS

Some embodiments comprise methods of forming patterns in which a second series of lines is overlaid across a first series of lines to form a grid. Such grid may be utilized to define a repeating pattern, and such a pattern may be utilized to fabricate an array of highly-integrated integrated circuitry, such as a DRAM array, a NAND memory array, etc.

Figure 63:
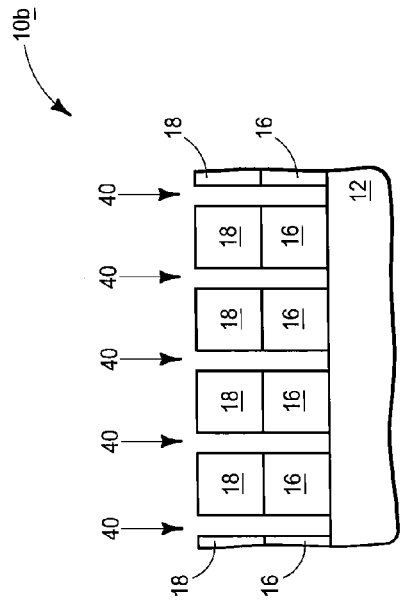
FIG. 63 shows the construction of FIG. 59 at a processing stage subsequent to that of FIG. 59 in accordance with another example embodiment method.

Example embodiments are described with reference to FIGS. 1-63.

Referring to FIGS. 1-4, a semiconductor construction 10 is shown in top view (FIG. 1) and cross-sectional side views (FIGS. 2-4). The construction comprises a base 12 and a stack 14 of materials 16, 18 and 20 over the base.

The base may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, the base may correspond to a semiconductor substrate containing one or more materials associated with integrated circuit fabrication. In such embodiments, such materials may correspond to one or more of refractory metal materials, barrier materials, diffusion materials, insulator materials, etc.

The materials 16, 18 and 20 may be selectively etchible relative to one another, and may comprise any suitable materials. For purposes of interpreting this disclosure and the claims that follow, a first material is considered to be "selectively etchible" relative to a second material if etching conditions may be chosen which remove the first material at a faster rate than the second material; which can include, but is not limited to, embodiments in which the first material is removed under conditions which are 100 percent selective for the first material relative to the second material.

In some embodiments, material 16 may be electrically insulative material which is ultimately patterned into a hard mask suitable for forming an integrated circuit pattern which extends into base 12 (as discussed below with reference to FIG. 63). In such embodiments, material 16 may comprise, consist essentially of, or consist of, for example, silicon nitride. In some embodiments, material 16 may be an electrically conductive material which ultimately supports electrically conductive contacts formed thereover (as discussed below with reference to FIG. 62). In such embodiments, material 16 may comprise, consist essentially of, or consist of, for example, one or more of various metals (e.g., copper, aluminum, tungsten, titanium, etc.), metal-containing compositions (e.g., metal nitrides, metal carbides, metal silicides, etc.), and conductively-doped semiconductor materials (e.g., conductively-doped silicon, conductively-doped germanium, etc.). In some embodiments, the material 16 may be considered to be an expanse which extends across at least a portion of base 12.

In some embodiments, material 18 may comprise, consist essentially of, or consist of silicon. For instance, material 18 may consist essentially of one or both of polycrystalline silicon and amorphous silicon.

In some embodiments, material 20 may comprise silicon oxynitride (e.g., a deposited antireflective composition (DARC)). In some embodiments, the silicon oxynitride maybe oxygen enriched.

The materials 16, 18 and 20 may be formed to any suitable thicknesses, and in some embodiments the individual materials may be formed to thicknesses of from about 50 Å to about 1000 Å.

In some embodiments, materials 18 and 20 are utilized to form a pattern which is ultimately transferred into one or more structures underlying the materials (for instance, the structures underlying materials 18 and 20 include the material 16 and the base 12 in the shown embodiment). In some embodiments, materials 18 and 20 may be referred to as stacked first and second materials, respectively, which are of different compositions relative to one another.

Patterned photoresist 22 is formed over the stack 14. The patterned photoresist may be formed utilizing photolithography, and in some embodiments may be referred to as a photolithographically-patterned photoresist mask. The patterned photoresist is configured as a plurality of spaced apart lines 24 (which may be referred to as features in some embodiments) extending across an upper surface of material 20. In the shown embodiment, the lines 24 extend primarily along a direction of an axis 5. Although the lines 24 are illustrated to be straight, in other embodiments the lines may be curved or wavy.

Referring next to FIGS. 5-8, the photoresist lines 24 are subjected to trimming to reduce widths of the lines. Although the tops of the lines 24 are shown to be unaffected by the trimming, in some embodiments the trimming conditions may decrease the heights of the lines and/or may induce other changes to the lines (e.g., may impose a dome-shape to the lines). For instance, trimming conditions may be chosen which isotropically etch the lines. The trimming of the lines may be omitted in some embodiments. If the trimming is utilized, such trimming may be accomplished with any suitable processing; including, for example, plasma etching with an inductively coupled reactor.

In some embodiments, the trimmed lines 24 at the processing stage of FIGS. 5-8 may have sub-lithographic widths. In some embodiments, the initial photoresist lines 24 formed at the processing stage of FIGS. 1-4 have widths of at least about 40 nanometers (nm), and the trimmed lines 24 at the processing stage of FIGS. 5-8 have widths of less than 40 nm, less than 20 nm, etc.

Referring next to FIGS. 9-12, the pattern of trimmed photoresist lines 24 (FIGS. 5-8) is transferred into material 20, and subsequently the photoresist lines are removed. The patterning of material 20 forms material 20 into a series of lines 26 over an upper surface of material 18, with the individual lines extending along the direction of axis 5. The lines 26 are spaced-apart from one another by spaces 28. The lines 26 and spaces 28 together define an undulating topography of construction 10.

Referring next to FIGS. 13-16, a material 30 is formed across the undulating topography of lines 26 and spaces 28. The material 30 may be a spin-on material, and may be deposited to a suitable thickness and under appropriate conditions to form the shown planarized surface 31 above lines 26. In some embodiments, material 30 may comprise one or more organic polymers, and accordingly may be a carbon-containing spin-on material. In some embodiments, material 30 may comprise other compositions besides spin-on compositions, and the planarized surface 31 may be formed by chemical-mechanical polishing (CMP) or other suitable planarization.

In some embodiments, material 30 may be referred to as a third material to distinguish it from the above-discussed first and second materials 18 and 20. In some embodiments, material 30 may be about twice as thick as material 20.

A hard mask material 32 is formed over surface 31, and patterned photoresist 34 is formed over the hard mask material. The patterned photoresist may be formed utilizing photolithography, and in some embodiments may be referred to as a photolithographically-patterned photoresist mask. The patterned photoresist is configured as a plurality of spaced-apart lines 36 (which may be referred to as features in some embodiments) extending across an upper surface of hard mask material 32. In the shown embodiment, the lines 36 extend primarily along a direction of an axis 7. The axis 7 intersects the axis 5 (described above in FIGS. 1-4). In the shown embodiment, axis 7 is substantially orthogonal to axis 5; with the term "substantially orthogonal" meaning that the axes are orthogonal to within reasonable tolerances of fabrication and measurement. In other embodiments, axis 7 may not be substantially orthogonal to axis 5, and accordingly may intersect axis 5 at an angle other than about 90°.

Although the lines 36 are illustrated to be straight, in other embodiments the lines may be curved or wavy.

The hard mask material 32 may comprise any suitable composition or combination of compositions, and in some embodiments may comprise, consist essentially of, or consist of silicon nitride, silicon oxynitride, etc.

Referring next to FIGS. 17-20, the pattern of photoresist lines 36 (FIGS. 13-16) is transferred through hard mask material 32 (FIGS. 13-16) and into material 30, and subsequently the hard mask material and photoresist lines are removed. The patterning of material 30 forms material 30 into a series of lines 38 extending over lines 26 and across an upper surface of the material 18, with the individual lines 38 extending along the direction of axis 7. In some embodiments, the lines 38 may be about twice as tall as the lines 26.

In some embodiments, the photoresist lines 36 (FIGS. 13-16) may be trimmed with processing analogous to that of FIGS. 5-8 prior to transferring the pattern of the photoresist lines into material 30. Accordingly, the lines 38 may have sub-lithographic widths at the processing stage of FIGS. 17-20.

Referring next to FIGS. 21-24, the lines 38 are subjected to trimming to reduce widths of the lines. Although the tops of the lines 38 are shown to be unaffected by the trimming, in some embodiments the trimming conditions may decrease the heights of the lines and/or may induce other changes to the lines (e.g., may impose a dome-shape to the lines). For instance, trimming conditions may be chosen which isotropically etch the lines. The trimming of the lines may be omitted in some embodiments. If the trimming is utilized, and the lines 38 comprise organic material, such trimming may be accomplished utilizing, for example, plasma etching with an inductively coupled reactor.

In some embodiments, the lines 38 at the processing stage of FIGS. 21-24 have widths of less than 40 nm, less than 20 nm, etc. In some embodiments, the trimmed lines 38 at the processing stage of FIGS. 21-24 may have sub-lithographic widths. In some embodiments, the trimming shown in FIGS. 21-24 may be omitted. In some embodiments, the photoresist lines 36 of FIGS. 13-16 may be trimmed additionally, or alternatively, to trimming the lines 38 of material 30.

In some embodiments, the lines 26 of material 20 may be referred to as first lines, and the lines 38 of material 30 may be referred to as second lines. Such first and second lines form a crosshatch pattern (or lattice) over material 18. Openings 40 (only some of which are labeled) extend through the crosshatch pattern, with such openings exposing regions of material 18.

In the shown embodiment, the first and second lines 26 and 38 are both on about the same pitch, $P_1$, and are orthogonal to one another. Accordingly, the openings 40 are substantially square. In other embodiments, the lines 38 may be at an angle which is other than orthogonal relative to the lines 26, and/or the lines 38 may be on a different pitch than the lines 26. Accordingly, the openings may be rectangular in some embodiments, and may be of other polygonal shapes besides square or rectangular in yet other embodiments. In some embodiments, the lines 26 and/or 38 may be curved or wavy, and thus at least some of the openings may have curved shapes.

In the shown embodiment the lines 38 have about the same widths as the lines 26, but in other embodiments the lines 38 may have different widths than the lines 26. In the shown embodiment, all of the openings 40 are about the same size and shape as one another. However, in some embodiments the lines 26 may be arranged in a pattern other than the shown uniform pitch, and/or the lines 38 may be arranged in a pattern other than the shown uniform pitch, which can enable openings 40 to be formed in a repeating pattern with some of the openings being larger and/or differently shaped than others.

Referring next to FIGS. 25-28, spacer material 42 (only some of which is labeled) is provided along and over the first and second lines 26 and 38, and then anisotropically etched to form spacers 44 (only some which are labeled). The spacers narrow the openings 40.

The spacer material 42 may comprise any suitable composition or combination of compositions; and in some embodiments may comprise, consist essentially of, or consist of silicon dioxide or silicon nitride.

Referring to FIGS. 29-32, the narrowed openings 40 are extended through material 18 to expose an upper surface of material 16. As discussed above, in some embodiments material 18 comprises silicon (e.g., polycrystalline and/or amorphous silicon), and material 16 comprise silicon nitride. Accordingly, in some embodiments the narrowed openings 40 are extended through a silicon-containing material to expose an upper surface of a silicon nitride-containing material. In some embodiments material 16 may be referred to as an expanse under material 18, and in such embodiments the narrowed openings may be considered to be extended through material 18 to expose an upper surface of the expanse. The openings 40 may be extended through material 18 with any suitable processing, including, for example, utilization of a plasma etch.

Referring next to FIGS. 33-36, the spacers 44 (FIGS. 29-32) are removed with an etch selective for the spacer material 42 (FIGS. 29-32) relative to materials 16, 18, 20 and 30. For purposes of interpreting this disclosure and the claims that follow, a first material is considered to be "selectively removed" relative to a second material if the first material is removed at a faster rate than the second material; which can include, but is not limited to, embodiments in which the first material is removed under conditions which are 100 percent selective for the first material relative to the second material. In some embodiments, the spacer material consists of silicon dioxide, material 16 consists of silicon nitride, material 18 consists of silicon, material 20 consists of silicon oxynitride, and material 30 consists of an organic polymer.

Referring next to FIGS. 37-40, exposed portions of material 20 are removed selectively relative to material 16, 18 and 30. Such removes portions of lines 26 (FIGS. 33-36) while leaving segments 48 of the lines 26 underneath the lines 38 of material 30. The cross-section of FIG. 40 shows some segments 48 of lines 26 under one of the lines 38 of material 30.

Referring next to FIGS. 41-44, the lines 38 of material 30 (FIGS. 37-40) are removed to uncover the segments 48 of material 20. In the shown embodiment, the segments 48 are pedestals having about the same dimensions as openings 40. In other embodiments, the pedestals may have other dimensions and/or shapes than openings 40.

The top view of FIG. 41 shows that the segments 48 (i.e., the segments of material 20) and the openings 40 together form a repeating pattern across the construction 10. The processing of FIGS. 45-60 aligns openings in material 18 to the locations of the segments 48.

Referring to FIGS. 45-48, a masking material 50 is formed between the segments 48. The masking material fills the openings 40, and leaves upper surfaces of the segments 48 exposed. The material 50 comprises a composition to which material 20 may be selectively removed, and may comprise any suitable substance. In some embodiments, the masking material 50 may comprise a spin-on carbon-containing material, and may be identical to the material 30 described above with reference to FIGS. 13-16. The material 50 may be formed in the shown configuration by initially forming material 50 to cover the segments 48, and then utilizing CMP or other suitable planarization to remove excess material 50 from over the segments 48; and/or utilizing a plasma etch to remove the excess material 50.

Referring next to FIGS. 49-52, the segments 48 (FIGS. 45-48) are removed selectively relative to material 50 to leave openings 52 extending through material 50 to an upper surface of material 18.

Referring to FIGS. 53-56, the openings 52 are extended through material 18 to an upper surface of material 16. The openings 52 may be extended through material 18 with any suitable processing, including, for example, utilization of a plasma etch.

Referring to FIGS. 57-60, the masking material 50 (FIGS. 53-56) is removed. The remaining material 18 is a patterned mask 60 having openings 40 and 52 extending therethrough. The openings 40 and 52 may be referred to as first and second openings, respectively. In the shown embodiment, such first and second openings are about the same size and shape as one another, but in other embodiments the second openings may be different sizes and/or shapes than the first openings. In the shown embodiment, the first and second openings are approximately square-shaped. In other embodiments, the openings may have other shapes, including rectangular shapes, other polygonal shapes, circular shapes, elliptical shapes, other curved shapes, etc. In the shown embodiment, the first openings 40 are all approximately the same size and shape as one another. As discussed above with reference to FIGS. 21-24, in other embodiments some of the openings 40 may be of different size and/or shapes relative to others of such openings. Thus, the patterned mask 60 may comprise the dense repeating pattern illustrated in FIGS. 57-60, or may comprise other patterns in other embodiments.

In some embodiments, the pattern of openings 40 and 52 of FIGS. 57-60 may be considered to be suitable for fabrication of a cross-point array of integrated structures. Such pattern may be tailored for particular applications by adjusting various aspects of the pattern including, for example, sizes of the openings, shapes of the openings, spacings between the openings, pitch regularity, etc.

Figure 61:
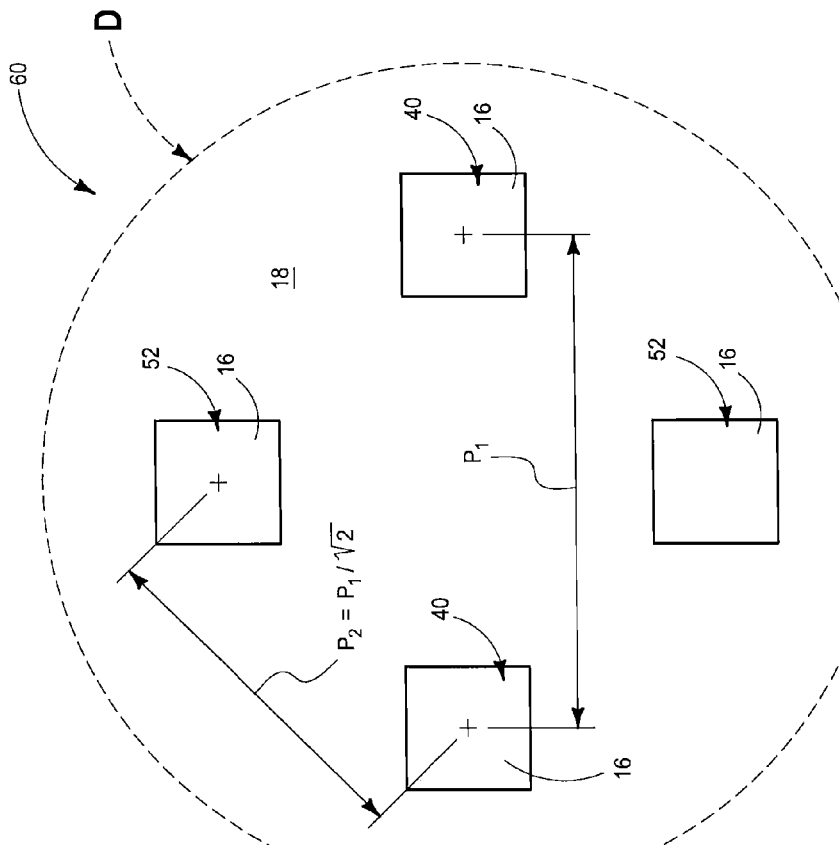
FIG. 61 shows an expanded view of a region labeled "D" in FIG. 57.

FIG. 61 shows an expanded region "D" of FIG. 57 and shows that the illustrated dense pattern of mask 60 may have a pitch $P_2$ which is reduced relative to the pitch $P_1$ of the lines 26 and 38 of FIGS. 21-24. In the shown embodiment, the pitch $P_2$ is reduced relative to $P_1$ by a factor of about $\sqrt{2}$.

Figure 62:
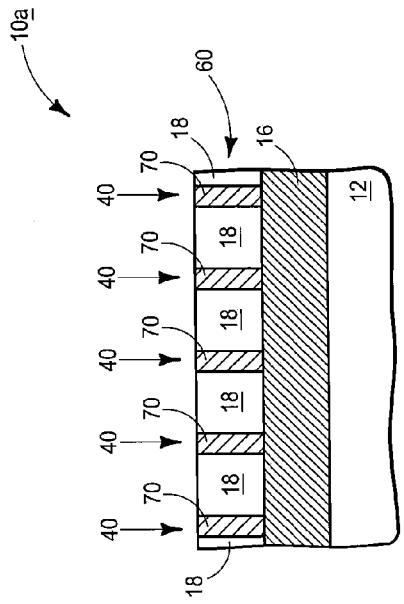
FIG. 62 shows the construction of FIG. 59 at a processing stage subsequent to that of FIG. 59 in accordance with an example embodiment method.

In subsequent processing, the patterned mask 60 may be utilized for patterning integrated circuitry. For instance, FIG. 62 shows a construction 10a at a processing stage subsequent to that of FIG. 59. The construction 10a comprises electrically conductive material 16, and the mask 60 is utilized for patterning a material 70 into electrically conductive interconnects that extend to the conductive material 16. As another example, FIG. 63 shows a construction 10b at a processing stage subsequent to that of FIG. 59 in which the openings 40 are extended through material 16 to upper surface of base 12. In subsequent processing, one or more materials may be formed within openings 40 during fabrication of integrated circuitry supported by base 12, and/or openings 40 may be extended into one or more materials of base 12, and/or one or more dopants may be implanted through openings 40 and into base 12. In some embodiments, the patterned mask 60 may be utilized for fabricating one or more components of highly-integrated memory circuitry; such as, for example, DRAM, NAND memory, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a pattern. A series of first lines are formed over a first material. A series of second lines are formed over the first lines. The first and second lines form a crosshatch pattern over the first material. Regions of the first material are exposed within first openings in the crosshatch pattern. The first openings are extended through the first material. Portions of the first lines that are not covered by the second lines are removed to pattern the first lines into segments. The second lines are removed to uncover the segments. Masking material is formed between the segments. The masking material fills the first openings. The segments are removed to form second openings extending through the masking material to the first material. The second openings are extended through the first material. The masking material is removed to leave a patterned mask comprising the first material having the first and second openings therein.

Some embodiments include a method of forming a pattern. Stacked first and second materials are formed over a base. The first and second materials are of different compositions relative to one another. The second material is over the first material. The second material is patterned into spaced-apart first lines extending primarily along a first direction. The first lines and spaces between the first lines define an undulating topography. A third material is formed over the undulating topography. The third material has a substantially planar upper surface. The third material is patterned into spaced-apart second lines extending primarily along a second direction that intersects the first direction. The first and second lines form a crosshatch pattern over the first material. Regions of the first material are exposed within first openings in the crosshatch pattern. Spacers are formed along sidewalls of the first and second lines to narrow the first openings in the crosshatch pattern. The narrowed first openings are extended through the first material. The spacers are removed. Portions of the first lines that are not covered by the second lines are removed to pattern the first lines into segments. The second lines are removed to uncover the segments. Masking material is formed between the segments. The masking material fills the narrowed first openings. The segments are removed to form second openings that extend through the masking material to the first material. The second openings are extended through the first material. The masking material is removed to leave a pattern of the second openings and the narrowed first openings within the first material.

Some embodiments include a method of forming a pattern. A first material is formed over an expanse. A second material is formed over the first material. The second material comprises a different composition from the first material. The second material is patterned into spaced-apart first lines extending primarily along a first direction. The first lines and spaces between the first lines define an undulating topography. Third material is deposited over the undulating topography with a spin-on process. The third material has a substantially planar upper surface. The third material is patterned into spaced-apart second lines extending primarily along a second direction that intersects the first direction. The first and second lines form a crosshatch pattern over the first material. Regions of the first material are exposed within first openings in the crosshatch pattern. Spacers are formed along sidewalls of the first and second lines to narrow the first openings in the crosshatch pattern. The spacers comprise a different material from the first and second materials. The narrowed first openings are extended through the first material. The spacers are removed. Portions of the first lines that are not covered by the second lines are removed to pattern the first lines into segments. The second lines are removed to uncover the segments. Masking material is formed between the segments. The masking material fills the narrowed first openings. The segments are removed to form second openings that extend through the masking material to the first material. The second openings are extended through the first material. The masking material is removed to leave a repeating pattern comprising the second openings and the narrowed first openings. The repeating pattern exposes an upper surface of the expanse.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a pattern, comprising:
   forming a series of first lines over a first material, the first material being over an underlying material selected from the group consisting of silicon nitride, metals, metal comprising compositions and conductively doped semiconductor materials;
   forming a series of second lines over the first lines; the first and second lines forming a crosshatch pattern over the first material; regions of the first material being exposed within first openings in the crosshatch pattern;
   extending the first openings through the first material;
   removing portions of the first lines that are not covered by the second lines to pattern the first lines into segments;
   removing the second lines to uncover the segments;
   forming masking material between the segments, the masking material filling the first openings;
   removing the segments to form second openings extending through the masking material to the first material;
   extending the second openings through the first material; and
   removing the masking material to leave a patterned mask comprising the first material having the first and second openings therein.

2. The method of claim 1 wherein the first material is over a base, and further comprising transferring a pattern from the patterned mask into the base.

3. The method of claim 2 wherein the base comprises an expanse of silicon nitride over a semiconductor substrate; and wherein the pattern is transferred into the expanse, and then from the expanse into one or more materials of the semiconductor substrate.

4. The method of claim 1 further comprising forming electrically conductive material within the first and second openings of the patterned mask.

5. The method of claim 1 further comprising forming anisotropically-etched spacers along sidewalls of the first and second lines to narrow the first openings prior to extending the first openings through the first material.

6. The method of claim 1 wherein the first material comprises amorphous silicon and/or polycrystalline silicon.

7. A method of forming a pattern, comprising:
   forming stacked first and second materials over a base, the first material being over an underlying material selected from the group consisting of silicon nitride, metals, metal comprising compositions and conductively doped semiconductor materials, the first and second materials being of different compositions relative to one another, the second material being over the first material;
   patterning the second material into spaced-apart first lines extending primarily along a first direction; the first lines and spaces between the first lines being an undulating topography;
   forming a third material over the undulating topography, the third material having a substantially planar upper surface;
   patterning the third material into spaced-apart second lines extending primarily along a second direction that intersects the first direction; the first and second lines forming a crosshatch pattern over the first material; regions of the first material being exposed within first openings in the crosshatch pattern;
   forming spacers along sidewalls of the first and second lines to narrow the first openings in the crosshatch pattern;
   extending the narrowed first openings through the first material;
   removing the spacers;
   removing portions of the first lines that are not covered by the second lines to pattern the first lines into segments;
   removing the second lines to uncover the segments;
   forming masking material between the segments, the masking material filling the narrowed first openings;
   removing the segments to form second openings extending through the masking material to the first material;
   extending the second openings through the first material; and
   removing the masking material to leave a pattern of the second openings and the narrowed first openings within the first material.

8. The method of claim 7 wherein the second direction is substantially orthogonal to the first direction.

9. The method of claim 7 wherein the patterning of the second material comprises forming a photolithographically-patterned photoresist mask over the second material, and transferring a pattern from the photoresist mask into the second material.

10. The method of claim 9 wherein the photolithographically-patterned photoresist mask comprises spaced-apart features, and further comprising trimming the features prior to transferring the pattern from the photoresist mask into the second material.

11. The method of claim 7 wherein the first material consists essentially of silicon, and wherein the second material comprises silicon oxynitride.

12. The method of claim 7 wherein the third material is formed over the undulating topography with a spin-on process.

13. The method of claim 12 wherein the third material is a carbon-containing material.

14. The method of claim 13 wherein the patterning of the third material into the second lines comprises forming a hard mask over the third material, forming a photolithographically-patterned photoresist mask over the hard mask, transferring a pattern from the photoresist mask into the hard mask, and transferring a pattern from the hard mask into the third material.

15. The method of claim 14 wherein the photolithographically-patterned photoresist mask comprises spaced-apart features, and further comprising trimming the features prior to transferring the pattern from the photoresist mask into the hard mask.

16. The method of claim 14 further comprising trimming the second lines prior to forming the spacers.

17. The method of claim 7 wherein the spacers comprise silicon dioxide or silicon nitride.

18. A method of forming a pattern, comprising:
   forming a first material over an expanse of underlying material selected from the group consisting of silicon nitride, metals, metal comprising compositions and conductively doped semiconductor materials;
   forming a second material over the first material, the second material comprising a different composition from the first material;
   patterning the second material into spaced-apart first lines extending primarily along a first direction; the first lines and spaces between the first lines being an undulating topography;
   depositing third material over the undulating topography with a spin-on process, the third material having a substantially planar upper surface;
   patterning the third material into spaced-apart second lines extending primarily along a second direction that intersects the first direction; the first and second lines forming a crosshatch pattern over the first material; regions of the first material being exposed within first openings in the crosshatch pattern;
   forming spacers along sidewalls of the first and second lines to narrow the first openings in the crosshatch pattern, the spacers comprising a different material from the first and second materials;
   extending the narrowed first openings through the first material;
   removing the spacers;
   removing portions of the first lines that are not covered by the second lines to pattern the first lines into segments;
   removing the second lines to uncover the segments;
   forming masking material between the segments, the masking material filling the narrowed first openings;
   removing the segments to form second openings extending through the masking material to the first material;
   extending the second openings through the first material; and
   removing the masking material to leave a repeating pattern comprising the second openings and the narrowed first openings; said repeating pattern exposing an upper surface of the expanse.

19. The method of claim 18 wherein the first lines have sub-lithographic widths.

20. The method of claim 18 wherein the second lines have sub-lithographic widths.

21. The method of claim 18 wherein the first and second lines have sub-lithographic widths.

22. The method of claim 18 wherein the masking material is a same composition as the third material, and is formed utilizing the spin-on process.

23. The method of claim 22 wherein the third material comprises carbon.

24. The method of claim 23 wherein the patterning of the third material into the second lines comprises forming a silicon nitride hard mask over the third material, forming a photolithographically-patterned photoresist mask over the hard mask, transferring a pattern from the photoresist mask into the hard mask, and transferring a pattern from the hard mask into the third material.

25. The method of claim 18 wherein the first spaced-apart lines are on a first pitch, where in the second spaced-apart lines are on the first pitch, and where the repeating pattern is on a pitch reduced by a factor of about $\sqrt{2}$ relative to the first pitch.

26. The method of claim 18 wherein the expanse is over a semiconductor substrate and comprises silicon nitride; and further comprising transferring the repeating pattern into the silicon nitride and then utilizing the patterned silicon nitride for patterning one or more materials formed over and/or within the semiconductor substrate.

27. The method of claim 18 wherein the expanse comprises electrically conductive material, and further comprising forming one or more electrically conductive materials within the openings of the repeating pattern and in electrical contact with the electrically conductive material of the expanse.

28. The method of claim 18 wherein the first material consists essentially of silicon and the second material consists essentially of silicon oxynitride.

29. The method of claim 18 wherein the first material consists essentially of silicon, the second material consists essentially of silicon oxynitride, and the spacers consist essentially of silicon dioxide or silicon nitride.

30. The method of claim 29 wherein the forming of the spacers comprises anisotropically-etching the silicon dioxide or silicon nitride.

* * * * *